United States Patent
Zhu et al.

(10) Patent No.: US 11,152,936 B2
(45) Date of Patent: Oct. 19, 2021

(54) GATE DRIVE CIRCUIT FOR REDUCING REVERSE RECOVERY CURRENT OF POWER DEVICE

(71) Applicant: SOUTHEAST UNIVERSITY, Jiangsu (CN)

(72) Inventors: Jing Zhu, Jiangsu (CN); Weifeng Sun, Jiangsu (CN); Bowei Yang, Jiangsu (CN); Siyuan Yu, Jiangsu (CN); Yangyang Lu, Jiangsu (CN); Longxing Shi, Jiangsu (CN)

(73) Assignee: SOUTHEAST UNIVERSITY, Jiangsu (CN)

( * ) Notice: Subject to any disclaimer, the term of this patent is extended or adjusted under 35 U.S.C. 154(b) by 0 days.

(21) Appl. No.: 17/044,623

(22) PCT Filed: Apr. 15, 2020

(86) PCT No.: PCT/CN2020/084856
§ 371 (c)(1),
(2) Date: Oct. 1, 2020

(87) PCT Pub. No.: WO2020/228468
PCT Pub. Date: Nov. 19, 2020

(65) Prior Publication Data
US 2021/0218396 A1    Jul. 15, 2021

(30) Foreign Application Priority Data
May 16, 2019   (CN) .......................... 201910406222.6

(51) Int. Cl.
*H03K 3/00*   (2006.01)
*H03K 17/08*  (2006.01)
(Continued)

(52) U.S. Cl.
CPC ........... *H03K 17/687* (2013.01); *H03K 19/20* (2013.01)

(58) Field of Classification Search
None
See application file for complete search history.

(56) References Cited

U.S. PATENT DOCUMENTS 8,253,399 B2 *   8/2012   Peterson ............. H02M 3/1588
                                                     323/282
10,090,751 B1   10/2018   Tsyrganovich et al.

FOREIGN PATENT DOCUMENTS

CN     101425746 A    5/2009
CN     102904220 A    1/2013
(Continued)

OTHER PUBLICATIONS

Search Report issued in corresponding International application No. PCT/CN2020/084856 dated Jul. 15, 2020 (English translation attached).

*Primary Examiner* — Kenneth B Wells
(74) *Attorney, Agent, or Firm* — Muncy, Geissler, Olds & Lowe, P.C.

(57) ABSTRACT

The present invention discloses a gate drive circuit for reducing a reverse recovery current of a power device, and belongs to the field of basic electronic circuit technologies. The gate drive circuit includes a high-voltage LDMOS transistor, a diode forming a freewheeling path when the diode is turned on or a low-voltage MOS transistor in anti-parallel connection with a body diode, and a voltage detection circuit. When the power device is turned off, a freewheeling current produced by an inductive load flows through a freewheeling diode, the voltage detection circuit detects that the freewheeling diode is turned on, and an output signal is processed by a control circuit, to cause the drive circuit to output a high level, so that channels of the power device and the high-voltage LDMOS transistor are (Continued)

turned on, the freewheeling current flows through the conductive channels, almost not through the freewheeling diode, and there is no reverse recovery current in the freewheeling diode at this time, thereby reducing the reverse recovery current of the power device.

8 Claims, 6 Drawing Sheets

(51) Int. Cl.
*H03K 17/16* (2006.01)
*H03K 17/687* (2006.01)
*H03K 19/20* (2006.01)

(56) References Cited

FOREIGN PATENT DOCUMENTS

| | | | |
|---|---|---|---|
| CN | 107493095 A | 12/2017 | |
| CN | 110138367 A | 8/2019 | |

\* cited by examiner

GATE DRIVE CIRCUIT FOR REDUCING REVERSE RECOVERY CURRENT OF POWER DEVICE

BACKGROUND

Technical Field

The present invention discloses a gate drive circuit for reducing a reverse recovery current of a power device, relates to monolithic integrated circuit (Monolithic IC) gate drive technologies, and belongs to the field of basic electronic circuit technologies.

Related Art

Figure 1:
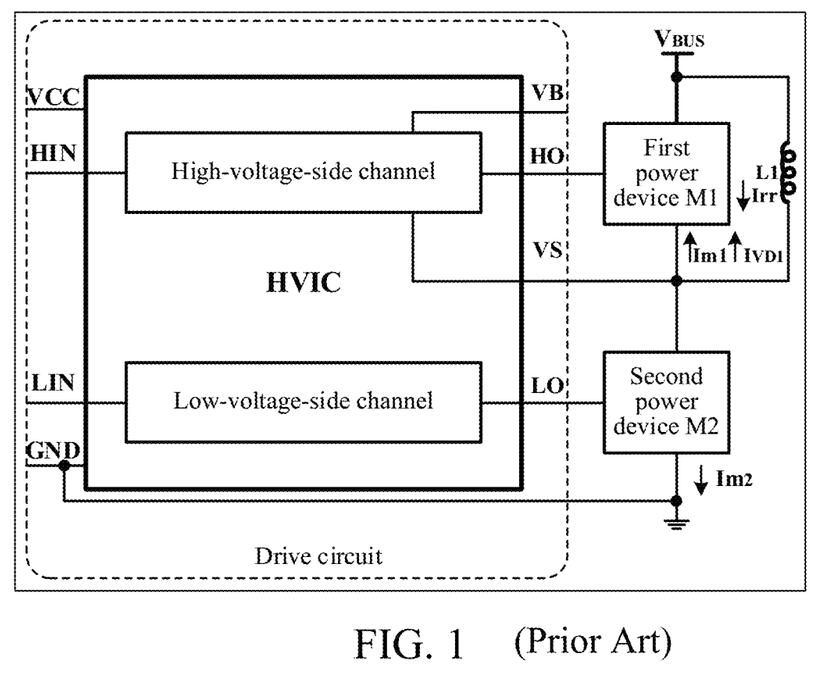
FIG. 1 is a structural diagram of a monolithic IC of an inside-integrated power device.

In the field of monolithic IC gate drive, power switch devices having excellent performance, such as high withstand voltage, high on-current density, and low on-resistance, have been widely used, such as a superjunction power metal oxide semiconductor field effect transistors (Superjunction MOSFETs) or lateral insulated gate bipolar transistors (LIGBTs) based on a silicon-on-insulator (SOI) technology. As shown in FIG. 1, a conventional monolithic IC consists of a drive circuit directly integrated with power devices.

The biggest problem of a conventional power metal oxide semiconductor (MOS) transistor is an excessively high on-state voltage drop in high-voltage operation, that is, an excessively high on-resistance. For an ideal N-channel power MOS transistor, a relationship between an on-resistance $R_{on}$ and a breakdown voltage VB is as follows (see literature: Chen Xingbi. Superjunction device [J]. *Power Electronics*, 2008, 42 (12): 2-7):

$$R_{on} \propto V_B^{2.5} \quad \text{(formula 1)}$$

The formula 1 indicates that the on-resistance is limited by the breakdown voltage, which is referred to as "a silicon limit", that is, it is impossible to achieve a low on-resistance while requiring a high withstand voltage for the power device. However, compared with the conventional power MOS transistor, the superjunction MOS transistor meets a requirement of the high withstand voltage (above 600 V) while greatly reducing the on-resistance on a same chip area. For the superjunction MOS transistor, a relationship between the on-resistance $R_{on}$ and the breakdown voltage VB is (see literature: Chen Xingbi. Superjunction device [J]. *Power Electronics*, 2008, 42 (12): 2-7):

$$R_{on} \propto V_B^{1.3} \quad \text{(formula 2)}$$

It can be proved by the formula 1 and the formula 2 that, at a same breakdown voltage, the superjunction MOS transistor has a significantly lower on-resistance than the conventional MOS transistor.

Figure 2:
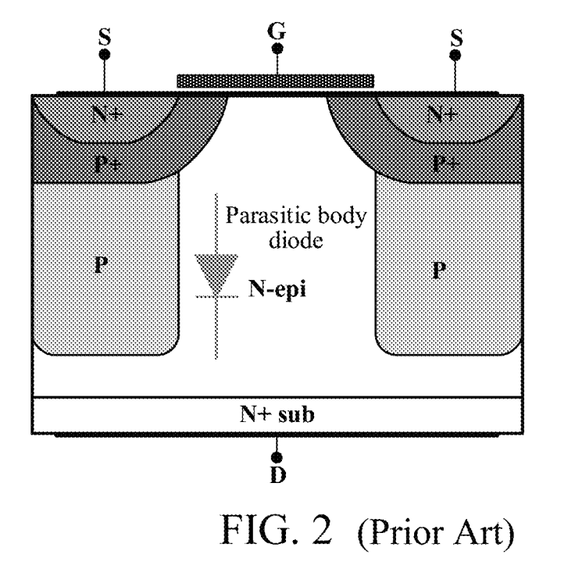
FIG. 2 is a structural diagram of an N-type superjunction MOS transistor.

A parasitic body diode in the superjunction MOS transistor provides a current freewheeling function during operation, protecting the superjunction MOS transistor from reverse electromotive force breakdown. However, a reverse recovery current in the parasitic body diode is extremely high. An N-type superjunction MOS transistor is shown in FIG. 2. A p-n junction columnar structure in a superjunction structure causes two serious consequences for the internal parasitic body diode: First, an area of the p-n junction is much larger than that of the conventional power MOS transistor, and when the parasitic body diode is turned on as a freewheeling diode, a large amount of unbalanced minority carriers accumulate, causing the superjunction MOS transistor to have a very high reverse recovery charge Qrr. Second, rapid depletion of the p-n junction columnar structure causes the unbalanced minority carriers to be rapidly discharged, that is, a reverse recovery time Trr is very short. Therefore, the reverse recovery current in the body diode in the superjunction MOS transistor is extremely high due to the very high reverse recovery charge of the body diode in the superjunction MOS transistor and the short reverse recovery time.

For the LIGBT based on the SOI technology, an LIGBT structure has no body diode. Therefore, the freewheeling diode that is in anti-parallel connection is required to provide a freewheeling path. Similarly, a reverse recovery current in the freewheeling diode is also very high.

Figure 3:
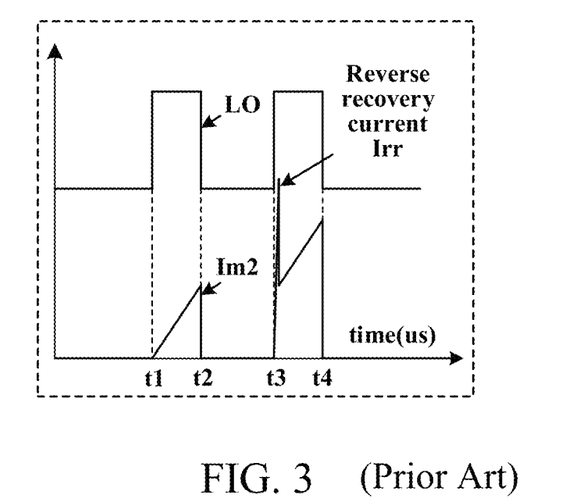
FIG. 3 is a waveform graph of a double-pulse test of a superjunction MOS transistor.

A double-pulse test waveform of the superjunction MOS transistor is shown in FIG. 3. At a moment t3, a peak value of the reverse recovery current in the freewheeling diode is very large, causing relatively high power consumption or even burnout of the body diode during reverse recovery.

Figure 4:
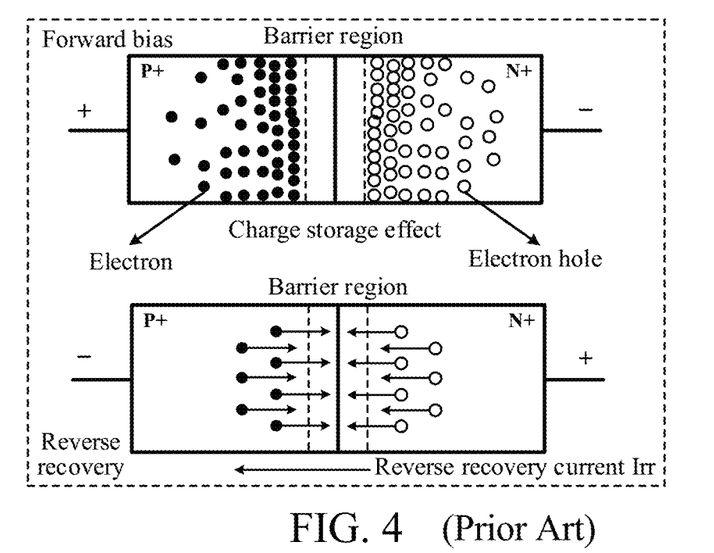
FIG. 4 is a diagram of a process of producing a reverse recovery current in a p-n junction diode.

Compared with the body diode of the superjunction MOS transistor or body diodes of other power devices, a p-n junction diode has a very low reverse recovery current. A process of producing the reverse recovery current of the p-n junction diode is shown in FIG. 4. When the p-n junction diode is forward biased, majority carrier electron holes in the P+ region flow to the N+ region, majority carrier electrons in the N+ region flow to the P+ region, and the electrons entering the P+ region and the electron holes entering the N+ region respectively become minority carriers in the regions, that is, the unbalanced minority carriers increase. A phenomenon of accumulation of the unbalanced minority carriers during forward conduction is usually referred to as a charge storage effect. When a reverse voltage is applied to the p-n junction diode, the unbalanced minority carriers gradually decrease in two ways: First, under the action of a reverse electric field, the electrons in the P+ region are pulled back to the N+ region, and the electron holes in the N+ region are pulled back to the P+ region, thereby forming the reverse recovery current, that is, minority carrier extraction occurs. Second, the unbalanced minority carriers are recombined with the majority carriers.

The minority carriers have a very low density, which cannot change significantly with a rise in a reverse bias voltage. As a result, before the breakdown voltage, the reverse recovery current formed by the minority carrier extraction is very low. Therefore, compared with the body diode of the superjunction MOS transistor, the p-n junction diode has a very low reverse recovery current.

To resolve the problem of an excessively high reverse recovery current of the power device, there are three existing technologies as follows:

(1) Heavy metal doping is used to form a new recombination center in a device drift layer for recombining excess unbalanced carriers, reducing a reverse recovery charge Qrr, and further reducing a reverse recovery current Irr. However, this method has a high process technology requirement, high costs, and a relatively high device leakage current.

(2) A radiation technology is used to form a defect in the device drift layer, thereby reducing a lifetime of the unbalanced minority carriers, reducing the reverse recovery charge Qrr, and further reducing the reverse recovery current Irr. However, the formed defect is extremely unstable, which affects reliability of the device, and the device leakage current is still relatively high.

(3) For the power devices that require anti-parallel freewheeling diodes such as the LIGBT, the freewheeling diode uses a Schottky structure. A Schottky diode conducts electricity with the majority carriers, and there is no minority carrier storage and recombination effect. Therefore, there is no reverse recovery current problem caused by the minority carriers. This technology requires an additional layer, and has a high process technology requirement, which increases costs.

Figure 5A:
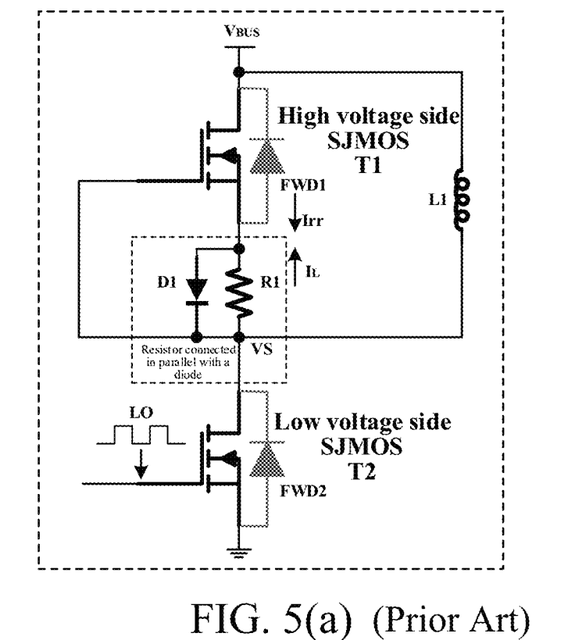
FIG. 5(a) is a circuit principle diagram of reducing a reverse recovery current of a superjunction MOS transistor in an existing technology.
Figure 5B:
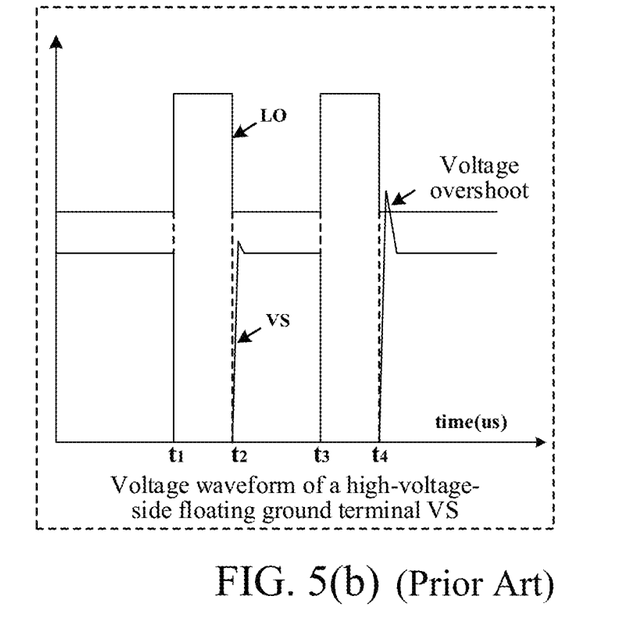
FIG. 5(b) is a waveform graph of a high-voltage-side floating ground terminal VS producing a relatively high overshoot voltage in FIG. 5(a)

In the existing technologies, there is a method of adding an additional resistor-diode in parallel structure to better resolve the above problem of excessively high reverse recovery current in the body diode in the superjunction MOS transistor. An idea of the method is that, when the body diode performs current freewheeling, a resistor is added between a gate and a source of a high-voltage-side superjunction MOS transistor to produce a voltage drop, so that a conductive channel of the high-voltage-side superjunction MOS transistor is open, a freewheeling current flows through the conductive channel, and there is almost no freewheeling current in the body diode. Therefore, the reverse recovery current in the body diode can be reduced. A circuit principle thereof is shown in FIG. 5(a). A network in which a resistor is connected in parallel with a diode is added between a source of a high-voltage-side superjunction MOS transistor T1 and a high-voltage-side floating ground terminal VS, one terminal of a resistor R1 is connected to an anode of an ordinary diode D1 and the source of the high-voltage-side superjunction MOS transistor T1, and the other terminal of the resistor R1 is connected to a cathode of the ordinary diode D1 at the high-voltage-side floating ground terminal VS. The gate of the high-voltage-side superjunction MOS transistor is directly connected to the high-voltage-side floating ground terminal VS, and an inductor L1 is added between a bus voltage $V_{BUS}$ and the high-voltage-side floating ground terminal VS as an inductive load. A double-pulse waveform is added to a gate of a low-voltage-side superjunction MOS transistor T2. After a first pulse decreases, that is, after a moment t2 shown in FIG. 3, the low-voltage-side superjunction MOS transistor T2 is turned off, the inductor L1 produces a freewheeling current $I_L$, and the freewheeling current $I_L$ flows to the source of the high-voltage-side superjunction MOS transistor T1, so that a voltage drop is formed at both terminals of the resistor R1. The voltage drop is a gate-source voltage Vgs of the high-voltage-side superjunction MOS transistor T1. The resistor R1 has a very high resistance value, to enable the voltage drop Vgs on both the terminals of the resistor to be greater than a turn-on voltage $V_{TH}$ of the high-voltage-side superjunction MOS transistor T1, so that the channel of the high-voltage-side superjunction MOS transistor T1 is turned on, the freewheeling current $I_L$ flows through the conductive channel of the high-voltage-side superjunction MOS transistor T1, there is almost no freewheeling current on the body diode FWD1, and there is almost no reverse recovery current Irr in the body diode FWD1. At a moment t3 in FIG. 3, after the low-voltage-side superjunction MOS transistor T2 is turned on, the ordinary diode D1 starts to conduct electricity. An equivalent on-resistance of the ordinary diode D1 is very low compared with the high-resistance resistor R1. Under the in-parallel condition, the high-resistance resistor R1 is basically ignored. The on-state voltage drop of the diode D1 is low, that is, the ordinary diode D1 being in parallel on both the terminals of the resistor can eliminate an impact of the high-resistance resistor R1 on the voltage of the high-voltage-side floating ground terminal VS at this time. This method resolves the problem of reducing the excessively high reverse recovery current in the body diode, but brings another severe problem. The excessively high resistance R1 causes the high-voltage-side floating ground terminal VS to produce a relatively high overshoot voltage when a second pulse of the gate of the low-voltage-side superjunction MOS transistor T2 decreases. As shown by a moment t4 in FIG. 5(b), the overshoot voltage has a relatively great impact on the performance and reliability of the power device.

SUMMARY

In view of the deficiencies of the background, an objective of the present invention is to provide a gate drive circuit for reducing a reverse recovery current of a power device. A freewheeling current flows through a conductive channel of the power device instead of a freewheeling diode of the power device, making a recovery current produced by the freewheeling diode extremely low, and resolving a technical problem of producing an overshoot voltage on a gate of a low-voltage-side superjunction MOS transistor by a drive circuit due to an excessively high resistance when a resistor-diode in-parallel structure is used to reduce a reverse recovery current of a body diode.

To achieve the foregoing objective, the following technical solutions are used in the present invention:

The gate drive circuit for reducing a reverse recovery current of a power device includes:

a high-voltage LDMOS transistor, a drain of the high-voltage LDMOS transistor and a drain of the power device being jointly connected to a bus voltage, and a gate of the high-voltage LDMOS transistor and a gate of the power device being jointly connected to an output terminal of a drive circuit;

a first diode, an anode of the first diode being connected to a source of the high-voltage LDMOS transistor, and a cathode of the first diode and a source of the power device being jointly connected to a ground;

a switch transistor being in series connection with the source of the high-voltage LDMOS transistor, a current input terminal of the switch transistor and the source of the power device being connected to the ground, and a current output terminal of the switch transistor being connected to the source of the high-voltage LDMOS transistor;

a voltage detection circuit, an input terminal of the voltage detection circuit being connected to the current output terminal of the switch transistor, and the voltage detection circuit outputting a detection value after detecting an on-state voltage drop of the switch transistor;

an OR gate, one input terminal of the OR gate being connected to an input signal on which analog-to-digital processing has been performed by a pre-stage circuit, and the other input terminal of the OR gate being connected to an output terminal of the voltage detection circuit; and a drive circuit, an input terminal of the drive circuit being connected to an output terminal of the OR gate, and the drive circuit outputting a drive signal for driving both the power device and the high-voltage LDMOS transistor to be turned on when the switch transistor is turned on.

In a further optimized solution for the gate drive circuit for reducing a reverse recovery current of a power device, the switch transistor being in series connection with the source of the high-voltage LDMOS transistor is a second diode being in anti-parallel connection with two electrodes of the first diode.

In a further optimized solution for the gate drive circuit for reducing a reverse recovery current of a power device, the switch transistor being in series connection with the source of the high-voltage LDMOS transistor is a low-voltage MOS transistor being in anti-parallel connection with a body diode, a gate of the low-voltage MOS transistor and the gate of the power device are jointly connected to the output terminal of the drive circuit, a drain of the low-voltage MOS transistor is connected to the source of the high-voltage LDMOS transistor, and a source of the low-voltage MOS transistor and the source of the power device are jointly connected to the ground.

Still further, when the gate drive circuit for reducing a reverse recovery current of a power device is configured to drive a high-voltage-side power device, the source of the power device, the cathode of the first diode, and the current input terminal of the switch transistor are jointly connected to a high-voltage-side floating ground.

Still further, when the gate drive circuit for reducing a reverse recovery current of a power device is configured to drive a low-voltage-side power device, the source of the power device, the cathode of the first diode, and the current input terminal of the switch transistor are jointly connected to a ground of the input signal.

Still further, in the gate drive circuit for reducing a reverse recovery current of a power device, the voltage detection circuit includes: a reference circuit, a first resistor, a second resistor and a voltage comparator, one terminal of the second resistor is connected to the current output terminal of the switch transistor, the other terminal of the second resistor and one terminal of the first resistor are both connected to a forward terminal of the voltage comparator, the other terminal of the first resistor is connected to one reference voltage outputted from the reference circuit, a reverse terminal of the voltage comparator is connected to the other reference voltage outputted from the reference circuit, and the voltage comparator outputs the detection value after detecting the on-state voltage drop of the switch transistor.

Still further, in the gate drive circuit for reducing a reverse recovery current of a power device, the two reference voltages outputted from the reference circuit meet the following constraint condition:

$$V_1 = (V_2 - V_d) \cdot \frac{R_2}{R_1 + R_2},$$

$V_1$ and $V_2$ respectively represent the reference voltages outputted to the reverse terminal and the forward terminal of the voltage comparator, $V_d$ represents a node potential of the cathode when the diode is turned on, $V_d = -0.7$ V, and $R_1$ and $R_2$ respectively represent resistance values of the first resistor and the second resistor. Preferably, the two reference voltages produced by the reference circuit in the voltage detection circuit are respectively 3.8 V and 5V.

Still further, in the gate drive circuit for reducing a reverse recovery current of a power device, the resistance values of the first resistor and the second resistor meet the following constraint condition:

$$V_1 = (V_2 - V_d) \cdot \frac{R_2}{R_1 + R_2} > 0.$$

Preferably, the resistance value of the resistor R2 is twice that of the resistor R1.

The above technical solutions of the present invention have the following beneficial effects:

(1) Conventional methods of resolving an excessively high reverse recovery current of the power device by radiation and heavy metal doping are abandoned, which saves costs and reduces the difficulty of process manufacturing.

(2) An ordinary diode or the low-voltage MOS transistor is used to replace a high-resistance resistor R1 used in the above existing technologies. The ordinary diode or the low-voltage MOS transistor has the very low on-state voltage drop, which can effectively reduce the overshoot voltage of a high-voltage-side floating ground terminal VS and reduce power consumption.

(3) A method of an LIGBT being in anti-parallel connection with a Schottky diode is abandoned, which does not add an additional layer while reducing the costs and difficulty of process manufacturing.

DETAILED DESCRIPTION

The technical solutions of the present invention are further described in detail below with reference to the accompanying drawings.

Figure 6:
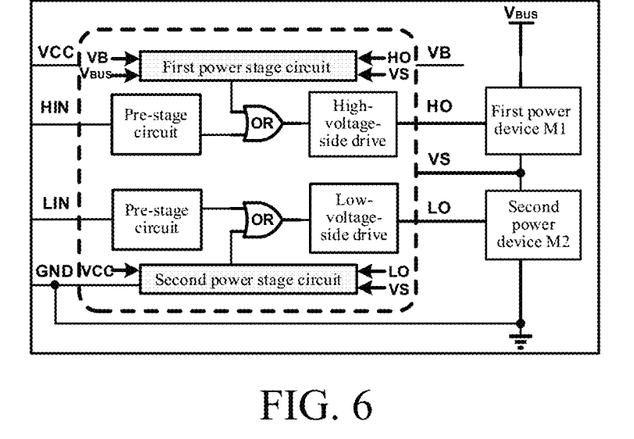
FIG. 6 is a structural block diagram of a circuit for reducing a reverse recovery current of a power device according to the present invention.

A circuit for reducing a reverse recovery current of a power device provided in the present invention is shown in FIG. 6. When a high-voltage-side first power device M1 is driven, a pre-stage circuit, a first power stage circuit, an OR gate and a high-voltage-side drive circuit form a high-voltage-side channel. When a low-voltage-side second power device M2 is driven, a pre-stage circuit, a second power stage circuit, an OR gate and a low-voltage-side drive circuit form a low-voltage-side channel. Structures and working principles of the first power stage circuit and the second power stage circuit are exactly the same, so that only the working principle and characteristics of the first power stage circuit are analyzed. After the second power device M2 is turned off, the first power stage circuit outputs a high level, which is processed by the OR gate with an output signal of the pre-stage circuit. The OR gate outputs the processed level and output signal to the high-voltage-side drive circuit, and an output signal of the high-voltage-side drive circuit opens a conductive channel of the first power device M1. A freewheeling current flows through the conductive channel instead of a freewheeling diode at this time, and the freewheeling diode produces an extremely low reverse recovery current, thereby reducing the reverse recovery current of the power device.

Embodiment 1: An objective of reducing the reverse recovery current of the power device is achieved by using a high-voltage LDMOS transistor connected to a high-voltage-side power device with a common drain and a common gate and an ordinary diode connected to the high-voltage LDMOS transistor in reverse series.

Figure 7:
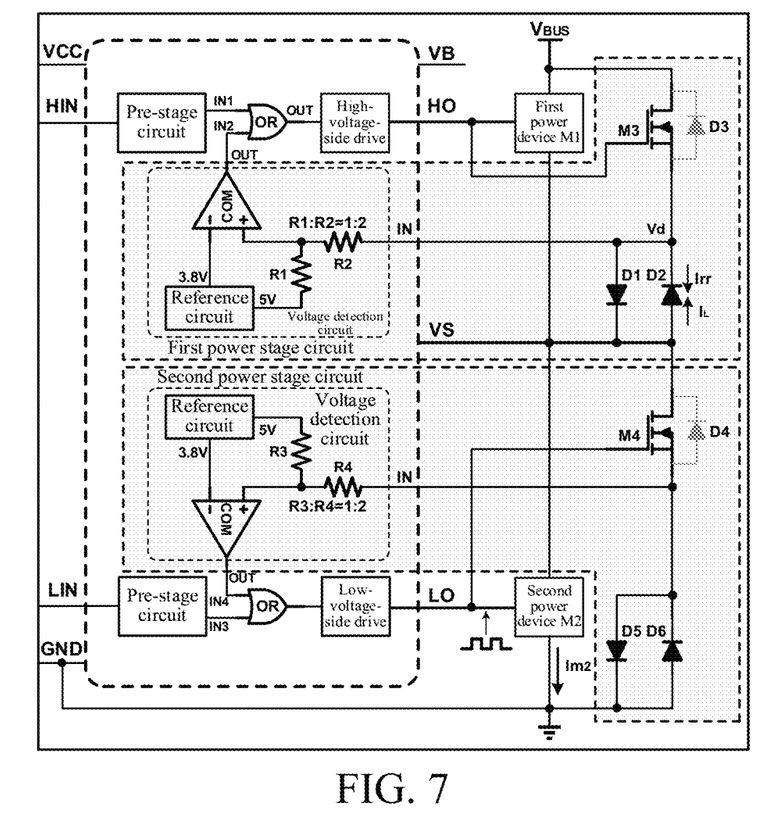
FIG. 7 is an embodiment of a circuit for reducing a reverse recovery current of a power device according to the present invention.

As shown in FIG. 7, a first power stage circuit of a high-voltage-side channel includes a high-voltage LDMOS transistor M3, a diode D1, a diode D2 and a voltage detection circuit. A drain of the high-voltage LDMOS transistor M3 is connected to a bus voltage $V_{BUS}$, a gate of the high-voltage LDMOS transistor M3 is connected to an output signal HO of a high-voltage-side drive circuit, an anode of the diode D2 is connected to a high-voltage-side floating ground VS, and a cathode of the diode D2 and a source of the high-voltage LDMOS transistor M3 are connected to an input terminal IN of the voltage detection circuit. After a second power device M2 is turned off, a freewheeling current produced by an inductive load flows through the diode D2, and the diode D2 is turned on. After detecting an on-state voltage drop of the diode D2, the voltage detection circuit outputs a high-level signal OUT to an input terminal IN2 of an OR gate. After OR processing of the high-level signal OUT and a signal outputted from a pre-stage circuit to an input terminal IN1 of the OR gate, the output signal HO of the high-voltage-side drive circuit is an OR operation result of the high level, so that a first power device M1 and a channel of the high-voltage LDMOS transistor M3 are turned on, the freewheeling current flows through the conductive channel, there is almost no freewheeling current through the high-voltage LDMOS transistor M3 and a body diode of the first power device M1, and therefore a reverse recovery current produced by the body diode is very low. When the second power device M2 is turned on, the diode D2 changes from a turned on state to a non-turned on state, at this time, the reverse recovery current produced by the ordinary diode D2 is very low compared with the power device, reducing the reverse recovery current of the power device.

As shown in FIG. 7, the voltage detection circuit of the high-voltage-side channel includes a reference circuit, a resistor R1, a resistor R2 and a voltage comparator. One reference voltage produced by the reference circuit is connected to a reverse terminal of the voltage comparator, the other reference voltage produced by the reference circuit is connected to one terminal of the resistor R1, the other terminal of the resistor R1 and one terminal of the resistor R2 are connected to a forward terminal of the voltage comparator, the other terminal of the resistor R2 as the input terminal IN of the voltage detection circuit is connected to the cathode of the diode D2, an output terminal of the voltage comparator is used as an output terminal of the voltage detection circuit, and the OUT outputted from the voltage detection circuit is connected to the input terminal IN2 of a subsequent OR gate.

As shown in FIG. 7, a second power stage circuit of a low-voltage-side channel includes a high-voltage LDMOS transistor M4, a diode D5, a diode D6 and a voltage detection circuit. A drain of the high-voltage LDMOS transistor M4 is connected to the high-voltage-side floating ground VS, a gate of the high-voltage LDMOS transistor M4 is connected to an output signal LO of a low-voltage-side drive circuit, an anode of the diode D6 is connected to the ground, and a cathode of the diode D6 and a source of the high-voltage LDMOS transistor M4 are connected to an input terminal IN of the voltage detection circuit. After the first power device M1 is turned off, the freewheeling current produced by the inductive load flows through the diode D6, and the diode D6 is turned on. After detecting an on-state voltage drop of the diode D6, the voltage detection circuit outputs a high-level signal OUT to an input terminal IN4 of an OR gate. After OR processing of the high-level signal and a signal outputted from a pre-stage circuit to an input terminal IN3 of the OR gate, the output signal LO of the low-voltage-side drive circuit is an OR operation result of the high level, so that the second power device M2 and a channel of the high-voltage LDMOS transistor M4 are turned on, the freewheeling current flows through the conductive channel, there is almost no freewheeling current through the high-voltage LDMOS transistor M4 and a body diode of the second power device M2, and therefore the reverse recovery current produced by the body diode is very low. When the first power device M1 is turned on, the diode D6 changes from the turned on state to the non-turned on state, at this time, the reverse recovery current produced by the ordinary diode D6 is very low compared with the power device, thereby reducing the reverse recovery current of the power device.

As shown in FIG. 7, the voltage detection circuit of the low-voltage-side channel includes a reference circuit, a resistor R3, a resistor R4 and a voltage comparator. One reference voltage produced by the reference circuit is connected to the inverting input terminal of the voltage comparator, the other reference voltage produced by the reference circuit is connected to one terminal of the resistor R3, the other terminal of the resistor R3 and one terminal of the resistor R4 are connected to the non-inverting input terminal of the voltage comparator, the other terminal of the resistor R4 as the input terminal IN of the voltage detection circuit is connected to the cathode of the diode D6, an output terminal of the voltage comparator is used as an output terminal of the voltage detection circuit, and the OUT outputted from the voltage detection circuit is connected to the input terminal IN4 of a subsequent OR gate.

In the first power stage circuit, the function of the diode D1 is to provide a conductive path for the voltage detection circuit when the high-voltage LDMOS transistor M3 and the diode D2 are turned off at the same time. In the second power stage circuit, the function of the diode D4 is to provide a conductive path for the voltage detection circuit when the high-voltage LDMOS transistor M4 and the diode D6 are turned off at the same time. Two reference voltages produced by the reference circuit in the voltage detection circuit meet the following constraint condition:

$$V_1 = (V_2 - V_d) \cdot \frac{R_2}{R_1 + R_2},$$

resistance values of the resistor R1 and the resistor R2 meet the following constraint condition:

$$V_1 = (V_2 - V_d) \cdot \frac{R_2}{R_1 + R_2} > 0,$$

$V_d$ represents a node potential of the cathode when the diode is turned on, and $V_d$=−0.7 V. In this embodiment, the two reference voltages produced by the reference circuit in the voltage detection circuit are respectively 3.8 V and 5 V, the resistance value of the resistor R2 is twice that of the resistor R1, and the resistance value of the resistor R4 is twice that of the resistor R3.

After the second power device M2 is turned off, the freewheeling current produced by the inductive load first flows through the diode D2, and the diode D2 is turned on. At this time, the cathode of the diode D2, that is, a potential of a node Vd, is a potential of the high-voltage-side floating ground VS minus 0.7 V, that is, the potential of a node Vd is −0.7 V. A negative voltage −0.7 V of the node Vd cannot be directly connected to the non-inverting terminal of the voltage comparator, at this time, voltage division of R1 and R2 is used to increase the negative voltage to an input range of the voltage comparator, and the resistance value of the resistor R2 is twice that of the resistor R1. The reference circuit provides the two reference voltage of 5 V and 3.8 V, a voltage V+ of the non-inverting terminal of the comparator can be calculated by the following resistor division formula:

$$V - = \frac{2}{3}(5 - V_d) \qquad \text{(formula 3)}$$

A voltage of a node V− is 3.8 V, that is, the reference voltage of 3.8 V is connected to the inverting input terminal of the voltage comparator. After detecting an on voltage of the diode D2, a subsequent voltage comparator outputs the high-level signal to the input terminal IN2 of the OR gate. The high-level signal IN2 and the pre-stage signal IN1 are used as two inputs of the OR gate, the output signal of the OR gate enables the output signal HO of the high-voltage-side drive circuit to be the high level, so that channels of the first power device M1 and the high-voltage LDMOS transistor M3 are turned on, the freewheeling current flows through the conductive channel, the freewheeling current almost does not flow through a body diode D3 and the freewheeling diode of the first power device, and there is no reverse recovery current in the body diode at this time. After the second power device M2 is turned on, the diode D2 changes from the turned on state to the non-turned on state, and the diode D2 produces a relatively low reverse recovery current. The function of the diode D1 is to provide a conductive path for the voltage detection circuit when the first power device M1, the high-voltage LDMOS transistor M3 and the diode D2 are turned off. In this embodiment, this circuit enables the freewheeling current to flow through the conductive channel of the power device instead of the freewheeling diode, the freewheeling diode almost does not produce the reverse recovery current, and only the ordinary diode produces the relatively low reverse recovery current. That is, the relatively low reverse recovery current of the ordinary diode is used to replace an extremely high reverse recovery current of the freewheeling diode in the power device, reducing the reverse recovery current of the power device.

Embodiment 2: An objective of reducing the reverse recovery current of the power device is achieved by using a high-voltage LDMOS transistor connected to a high-voltage-side power device with a common drain and a common gate and a low-voltage MOS transistor connected to the high-voltage LDMOS transistor in series.

Figure 8:
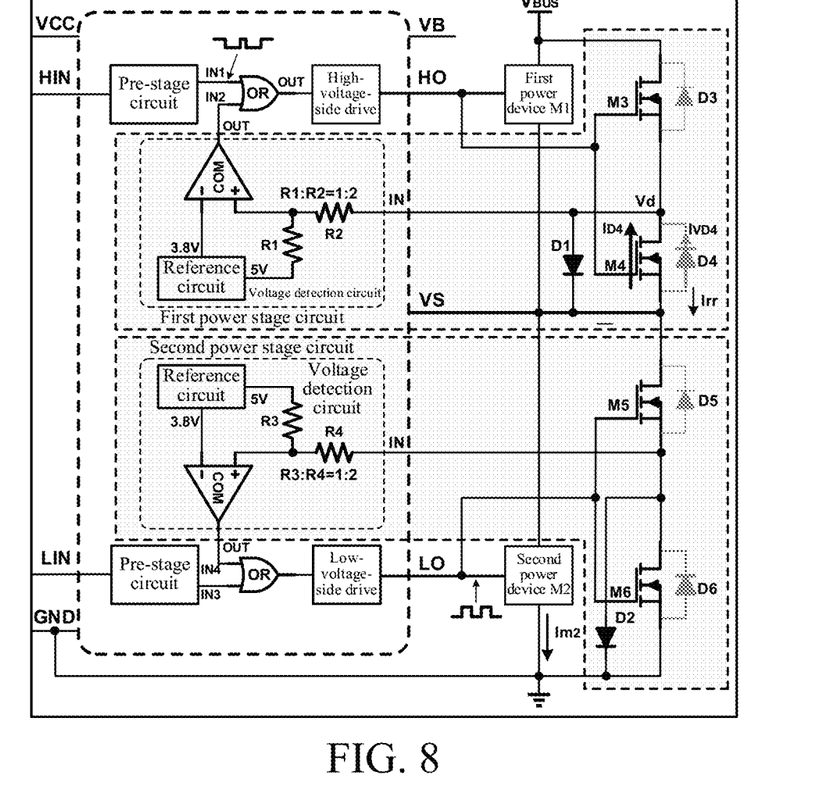
FIG. 8 is another embodiment of a circuit for reducing a reverse recovery current of a power device according to the present invention.

Another circuit for reducing the reverse recovery current of the power device provided in the present invention is shown in FIG. 8. In this embodiment, structures and working principles of a first power stage circuit and a second power stage circuit are exactly the same. Therefore, only the working principle and characteristics of the first power stage circuit are analyzed. The first power stage circuit includes a high-voltage LDMOS transistor M3, a low-voltage MOS transistor M4, a diode D1, and a voltage detection circuit. The voltage detection circuit includes a reference circuit, a resistor R1, a resistor R2, and a voltage comparator.

After the second power device M2 is turned off, a freewheeling current produced by an inductive load first flows through a body diode D4 of the low-voltage MOS transistor M4 and a body diode D3 of the high-voltage LDMOS transistor M3, and the body diode D4 of the low-voltage MOS transistor M4 is turned on. At this time, a cathode of the diode D4, that is, a potential of a node Vd, is a potential of a high-voltage-side floating ground VS minus 0.7 V, that is, the potential of a node Vd is −0.7 V. A negative voltage −0.7 V of the node Va cannot be directly connected to a non-inverting terminal of the voltage comparator, at this time, a voltage division circuit of R1 and R2 is used to increase the negative voltage to an input range of the voltage comparator, and the resistance value of the resistor R2 is twice that of the resistor R1. The reference circuit provides the two reference voltages of 5 V and 3.8 V, a voltage V+ of the non-inverting terminal of the comparator can be calculated by the following resistor division formula:

$$V - = \frac{2}{3}(5 - V_d) \qquad \text{(formula 4)}$$

A voltage of a node V− is 3.8 V, that is, the reference voltage of 3.8 V is connected to the inverting input terminal of the voltage comparator. After detecting an on voltage of a diode D2, a subsequent voltage comparator outputs a high-level signal to an input terminal IN2 of an OR gate. The high-level signal IN2 and a pre-stage signal IN1 are used as two inputs of the OR gate, an output signal of the OR gate enables an output signal HO of a high-voltage-side drive circuit to be the high level, so that channels of a first power device M1, the high-voltage LDMOS transistor M3 and the low-voltage MOS transistor M4 are turned on, the freewheeling current flows through the conductive channel and almost does not flow through the body diode D3, the body diode D4 and a freewheeling diode in the first power device, and there is no reverse recovery current in the body diode at this time. The function of the diode D1 is to provide a conductive path for the voltage detection circuit when the first power device M1, the low-voltage MOS transistor M4 and the body diode D4 are turned off. In this embodiment, this circuit enables the freewheeling current to flow through the conductive channel of the power device instead of the freewheeling diode as well, the freewheeling diode almost does not produce the reverse recovery current, and no ordinary diode produces the reverse recovery current, thereby reducing the reverse recovery current of the power device.

Figure 9A:
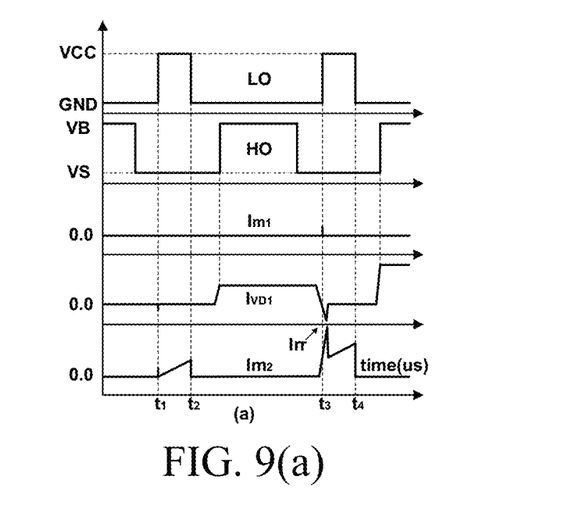
FIGS. 9(a) and 9(b) are comparison graphs of working waveforms between a circuit shown in FIG. 8 and a conventional circuit in FIG. 1.

As shown in FIG. 9(a) (a working waveform graph of a conventional circuit structure in FIG. 1), at a moment $t_3$, a freewheeling current $I_{m1}$ of the conductive channel of the first power device M1 is extremely low, and a freewheeling current $I_{VD1}$ almost all flows through the body diode of the first power device M1, thereby producing a very high reverse recovery current $I_{rr}$.

Figure 9B:
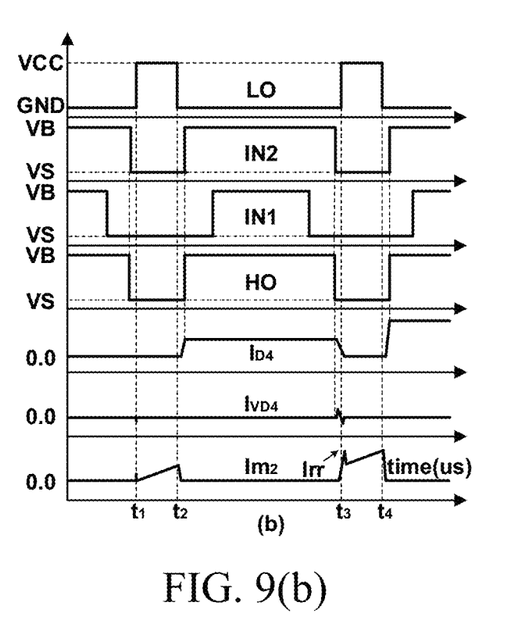

As shown in FIG. 9(b) (a working waveform graph of a circuit structure in FIG. 6), at a moment $t_3$, compared with FIG. 9(a), a freewheeling current ID4 almost all flows through the conductive channels of the high-voltage LDMOS transistor M3 and the low-voltage MOS transistor M4, and a reverse recovery current $I_{VD4}$ of the body diode D3 and the body diode D4 is extremely low, thereby producing a very low reverse recovery current $I_{rr}$.

The foregoing descriptions are merely preferred embodiments of the present invention, but do not limit the protection scope of the present invention. A person skilled in the art may make modifications and/or changes similar to or equal to the foregoing embodiments according to the present invention. Any modification, equivalent replacement, or improvement made within the spirit and principle of the present invention shall fall within the protection scope of the present invention.

What is claimed is:

1. A gate drive circuit for reducing a reverse recovery current of a power device, comprising:
   a high-voltage LDMOS transistor, a drain of the high-voltage LDMOS transistor and a drain of the power device being jointly connected to a bus voltage, and a gate of the high-voltage LDMOS transistor and a gate of the power device being jointly connected to an output terminal of a drive circuit;
   a first diode, an anode of the first diode being connected to a source of the high-voltage LDMOS transistor, and a cathode of the first diode and a source of the power device being jointly connected to a ground;
   a switch transistor being in series connection with the source of the high-voltage LDMOS transistor, a current input terminal of the switch transistor and the source of the power device being connected to the ground, and a current output terminal of the switch transistor being connected to the source of the high-voltage LDMOS transistor;
   a voltage detection circuit, an input terminal of the voltage detection circuit being connected to the current output terminal of the switch transistor, and the voltage detection circuit outputting a detection value after detecting an on-state voltage drop of the switch transistor;
   an OR gate, one input terminal of the OR gate being connected to an input signal on which analog-to-digital processing has been performed by a pre-stage circuit, and the other input terminal of the OR gate being connected to an output terminal of the voltage detection circuit; and
   a drive circuit, an input terminal of the drive circuit being connected to an output terminal of the OR gate, and the drive circuit outputting a drive signal for driving both the power device and the high-voltage LDMOS transistor to be turned on when the switch transistor is turned on.

2. The gate drive circuit for reducing a reverse recovery current of a power device according to claim 1, wherein the switch transistor being in series connection with the source of the high-voltage LDMOS transistor is a second diode being in anti-parallel connection with two electrodes of the first diode.

3. The gate drive circuit for reducing a reverse recovery current of a power device according to claim 1, wherein the switch transistor being in series connection with the source of the high-voltage LDMOS transistor is a low-voltage MOS transistor being in anti-parallel connection with a body diode, a gate of the low-voltage MOS transistor and the gate of the power device are jointly connected to the output terminal of the drive circuit, a drain of the low-voltage MOS transistor is connected to the source of the high-voltage LDMOS transistor, and a source of the low-voltage MOS transistor and the source of the power device are jointly connected to the ground.

4. The gate drive circuit for reducing a reverse recovery current of a power device according to claim 1, wherein when the gate drive circuit is configured to drive a high-voltage-side power device, the source of the power device, the cathode of the first diode, and the current input terminal of the switch transistor are jointly connected to a high-voltage-side floating ground.

5. The gate drive circuit for reducing a reverse recovery current of a power device according to claim 1, wherein when the gate drive circuit is configured to drive a low-voltage-side power device, the source of the power device, the cathode of the first diode, and the current input terminal of the switch transistor are jointly connected to a ground of the input signal.

6. The gate drive circuit for reducing a reverse recovery current of a power device according to claim 1, wherein the voltage detection circuit comprises: a reference circuit, a first resistor, a second resistor, and a voltage comparator, one terminal of the second resistor is connected to the current output terminal of the switch transistor, the other terminal of the second resistor and one terminal of the first resistor are both connected to a non-inverting input terminal of the voltage comparator, the other terminal of the first resistor is connected to one reference voltage outputted from the reference circuit, an inverting input terminal of the voltage comparator is connected to the other reference voltage outputted from the reference circuit, and the voltage comparator outputs the detection value after detecting the on-state voltage drop across the switch transistor.

7. The gate drive circuit for reducing a reverse recovery current of a power device according to claim 6, wherein the two reference voltages outputted from the reference circuit meet the following constraint condition:

$$V_1 = (V_2 - V_d) \cdot \frac{R_2}{R_1 + R_2},$$

$V_1$ and $V_2$ respectively represent the reference voltages outputted to the inverting input terminal and the non-inverting input terminal of the voltage comparator, $V_d$ represents a node potential of the cathode when the diode is turned on, $V_d$=−0.7 V, and $R_1$ and $R_2$ respectively represent resistance values of the first resistor and the second resistor.

8. The gate drive circuit for reducing a reverse recovery current of a power device according to claim 7, wherein the resistance values of the first resistor and the second resistor meet the following constraint condition:

$$V_1 = (V_2 - V_d) \cdot \frac{R_2}{R_1 + R_2} > 0.$$

* * * * *